US011283426B2

(12) United States Patent
Kushnir et al.

(10) Patent No.: US 11,283,426 B2
(45) Date of Patent: Mar. 22, 2022

(54) ELECTRICAL DEVICE, ELECTRICAL SYSTEM WITH AN ELECTRICAL DEVICE AND METHOD TO PROVIDE AN ELECTRICAL DEVICE

(71) Applicant: Apple Inc., Cupertino, CA (US)

(72) Inventors: Igal Kushnir, Hod-Hasharon (IL); Harry Skinner, Beaverton, OR (US); Bernhard Raaf, Neuried (DE); Sharon Malevsky, Tel-Aviv (IL); Gil Horovitz, Emek-Hefer (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/956,960

(22) PCT Filed: Dec. 29, 2017

(86) PCT No.: PCT/US2017/068868
§ 371 (c)(1),
(2) Date: Jun. 22, 2020

(87) PCT Pub. No.: WO2019/132950
PCT Pub. Date: Jul. 4, 2019

(65) Prior Publication Data
US 2020/0395916 A1 Dec. 17, 2020

(51) Int. Cl.
*H03H 9/46* (2006.01)
*H04B 1/12* (2006.01)
*H03B 5/36* (2006.01)
*H04B 1/40* (2015.01)

(52) U.S. Cl.
CPC .............. *H03H 9/46* (2013.01); *H03B 5/36* (2013.01); *H04B 1/12* (2013.01); *H04B 1/40* (2013.01)

(58) Field of Classification Search
CPC ..... H03H 9/46; H03B 5/36; H04B 1/12; H04B 1/40
USPC .......................................................... 455/73
See application file for complete search history.

(56) References Cited

U.S. PATENT DOCUMENTS

| | | | |
|---|---|---|---|
| 2003/0184402 A1 | 10/2003 | Ishizaki et al. | |
| 2009/0267700 A1* | 10/2009 | Mohanty | H03L 1/00 331/175 |
| 2011/0018649 A1 | 1/2011 | David et al. | |
| 2017/0272056 A1 | 9/2017 | Lin et al. | |

FOREIGN PATENT DOCUMENTS

| | | |
|---|---|---|
| JP | 2009519643 A | 5/2009 |
| KR | 101703452 B1 | 2/2017 |

OTHER PUBLICATIONS

International Search Report and Written Opinion for PCT/US2017/068868, dated Sep. 18, 2018, 10 pgs.

* cited by examiner

*Primary Examiner* — Lee Nguyen
(74) *Attorney, Agent, or Firm* — Kowert, Hood, Munyon, Rankin & Goetzel, P.C.

(57) ABSTRACT

An electrical device (100) that comprises at least one signal filter (104) comprising a plurality of mechanical resonators (106 108, 110) in a substrate (102) and at least one further mechanical resonator (112) in the substrate (102) configured to oscillate at a reference frequency of an oscillator signal. An electrical system (300) comprising an electrical oscillator (306) a transceiver (302) and an antenna (310), and an electrical device (100). A method (1300) for providing an electrical device (100).

19 Claims, 12 Drawing Sheets

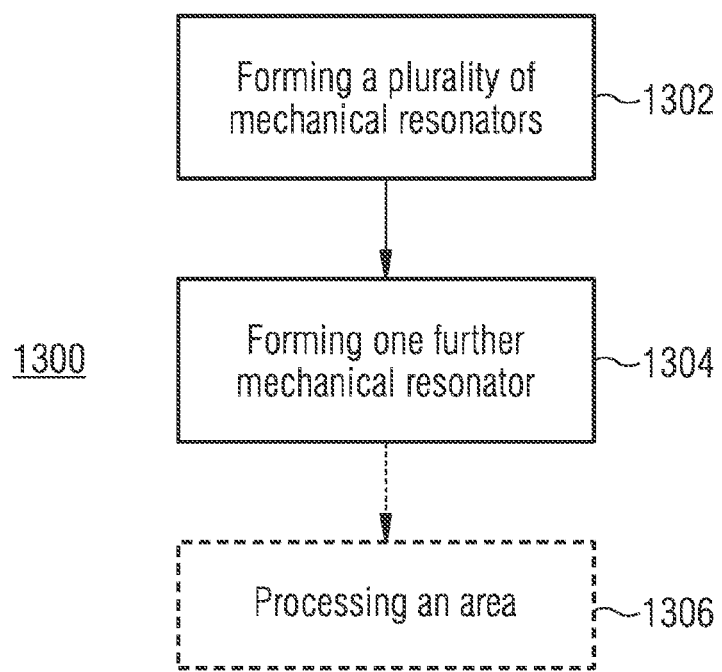

ELECTRICAL DEVICE, ELECTRICAL SYSTEM WITH AN ELECTRICAL DEVICE AND METHOD TO PROVIDE AN ELECTRICAL DEVICE

FIELD

Examples relate to an electrical device, an electrical system comprising an electrical device and methods for providing an electrical device.

BACKGROUND

Electrical devices may comprise signal filters and mechanical resonators for signal processing in e.g. transmit or receive paths in mobile devices. A signal filter may have a bandpass characteristic and a high slew rate and a mechanical resonator may be used to generate an oscillator signal.

There may be a desire for improved electrical devices with signal filters and mechanical resonators with reduced sized size and costs.

BRIEF DESCRIPTION OF THE FIGURES

Some examples of apparatuses and/or methods will be described in the following by way of example only, and with reference to the accompanying figures, in which

FIG. 13 illustrates a flow chart of a method for providing an electrical device.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
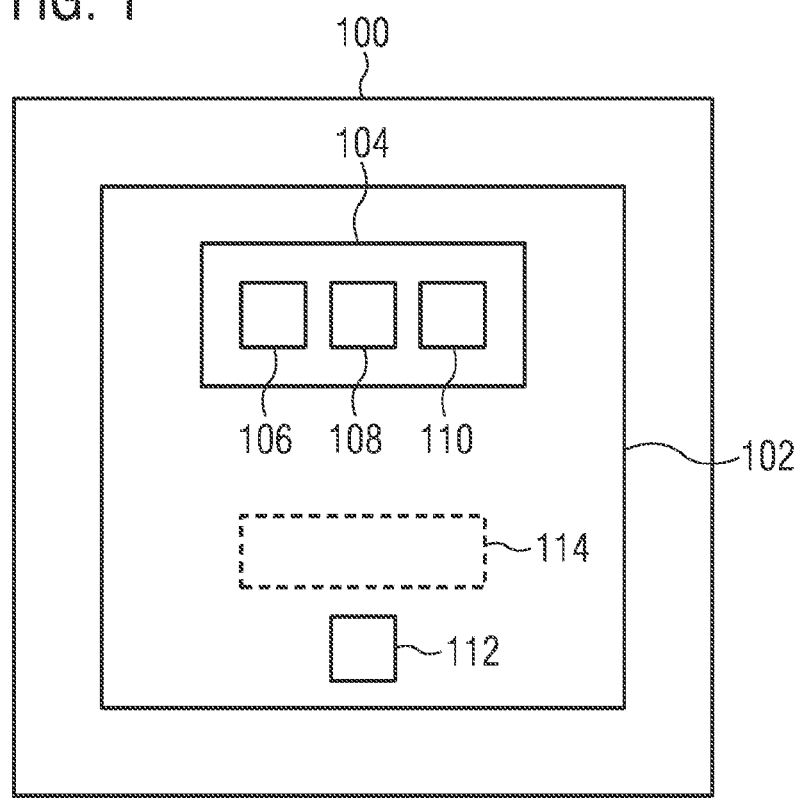
FIG. 1 illustrates an example of an electrical device with a signal filter and a mechanical resonator.

FIG. 1 illustrates an example of an electrical device 100. The electrical device 100 comprises a substrate 102 with a signal filter 104 and a mechanical resonator 112. Both the signal filter 104 and the mechanical resonator 112 are provided in the substrate 102 that can be a die or a piece of semiconducting material. The signal filter itself comprises a plurality of mechanical resonators 106, 108, 110 (and a number of further mechanical resonators that are not shown in FIG. 1) as filter components which are configured to provide a predefined filter characteristic of the signal filter 104, e.g. a band-pass filter. A signal filter can be e.g. a coexistence filter like a FDD duplexer, a WiFi RX coexistence filter, etc., that can be used in numerous communication systems. To be usable in a communication system, the signal filter comprises an input-port and an output-port that are provided as signal filter ports of the electrical device 100. Via the signal filter ports, the signal filter 104 can be connected to a transceiver on one end and to an antenna or a RFEM (Radio Front End Module) on another end. The signal filter is thus configured to filter an electrical signal according to a predefined function. The mechanical resonators of the plurality of mechanical resonators may be similar to the further mechanical resonator, similar e.g. with respect to a type of resonator, a technology of the resonator, or materials used for providing or manufacturing the resonator. All mechanical resonators 106, 108, 110, 112 of the substrate 102 thus may be manufactured in a common semiconductor process or processes which might reduce the costs of electrical device 100 significantly compared to a signal filter 104 and a mechanical resonator 112 on respective separated substrates.

The further mechanical resonator 112 is configured to oscillate at a reference frequency of an oscillator signal. Oscillators may require an external high-Q resonator which due to its size may not be integrable into a device comprising the oscillator itself, as for example a radio transceiver device. In other words, the further mechanical resonator 112 is configured to be a resonator or external resonator of an oscillator. The mechanical resonator therefore provides a reference frequency that is e.g. a fundamental frequency of the mechanical resonator. The mechanical resonator comprises an electrical port, e.g. to connect it to the oscillator. The port can be provided by the electrical device 100 as a resonator port. The resonator port or implementation of the resonator port can be separated or independent from the signal filter ports.

A mechanical resonator according to the described example and the following examples is an electromechanical element with a mechanically resonating structure. The mechanically resonating structure can be stimulated to oscillate via electro-mechanical coupling such as by piezoelectric effect or capacitive coupling. In other words, a mechanical oscillation of the mechanical resonator can be induced by an electrical signal. A mechanical resonance frequency can be determined by a specific geometry and/or a specific material of the mechanical resonator. By using appropriate materials a mechanical resonator can achieve a particularly high quality factor (Q-factor), hence a mechanical resonator is also called a high-Q-resonator. Such mechanical resonators or high-Q-resonators can be microelectronic elements or MEMS (micro electro mechanical system)-elements and/or can be acoustic wave resonators.

Examples of a mechanical resonator thus can be BAW (bulk acoustic wave)-resonators, SAW (surface acoustic wave)-resonators, ceramic resonators or MEMS-resonators such as electrostatically coupled ring-resonators or beam-resonators based on semiconductor manufacturing processes. It is for example possible that the signal filter comprises BAW-resonators and can be referred to as BAW-filter. Signal filters comprising such high-Q resonators can provide a bandpass function comprising small bandwidth and steep slew rates which might be required in modern mobile applications.

The plurality of mechanical resonators of the signal filter 104 can be separated from the further mechanical resonator 112. Separated means at least electrically separated, i.e. no direct electrical connection between the plurality of mechanical resonators of the signal filter 104 and the further mechanical resonator 112 is provided. In other words, the further mechanical resonator 112 is at least electrically isolated from the signal filter 104 and its components, i.e. the plurality of mechanical resonators. This means that the signal filter 104 and the further mechanical resonator 112 work independently from each other while being provided on a common or same substrate 102 or die in electrical device 100. The example shows how a signal filter with mechanical resonators and a further mechanical resonators for an oscillator can be provided e.g. in a common package of electrical device 100 while providing different functionalities e.g. for a communication system. The effect by providing the mechanical resonators 106, 108, 110 of signal filter 104 and the further mechanical resonator 112 on the same substrate can be a reduction of size compared to respective standalone components as well as reducing costs compared to respective stand-alone components, i.e. one electrical device comprising a signal filter and another electrical device comprising the resonator for the oscillator signal, the two electrical devices e.g. being provided in separated housings or packages or substrates. Reducing size and costs can be possible because building the further mechanical resonator 112 on a substrate or same die with the plurality of mechanical resonators may require less effort and manufacturing time as well as less material than e.g. building a second electrical device with a further substrate. It is possible that in total less substrate surface can be needed and thus a small footprint of device 100 could be achieved.

In an example it is possible that the substrate 102 is the only substrate within the electrical device 100 or the only substrate of the electrical device 100. In other words, the device 100 might provide exclusively a functionality of the signal filter and the resonator for a reference frequency for an oscillator and the device comprises the substrate 102 e.g. in a package with respective electrical ports configured to connect the signal filter 104 and the mechanical resonator 112 to further independent electrical devices like a transceiver and/or an oscillator. Such an electrical device 100 might result in a small package size, especially small compared to a signal filter and a mechanical resonator which are provided in respective individual packages because the electrical device 100 provides both the signal filter 104 and the further mechanical resonator 112 on the same substrate. The size of a substrate comprising a signal filter with a plurality of mechanical resonator, e.g. 8, 12, or 20 mechanical resonators, may only slightly increase if one single further mechanical resonator is provided on the same substrate. This might e.g. in a mobile device reduce a required space for a signal filter and a resonator for an oscillator. Some examples relate to an electrical device 100 comprising two or more signal filters with respective ports and/or two or more further mechanical resonators with respective ports. In these examples size and cost may be further reduced compared to e.g. individual electrical devices comprising the further signal filters and/or mechanical resonators.

Figure 2:
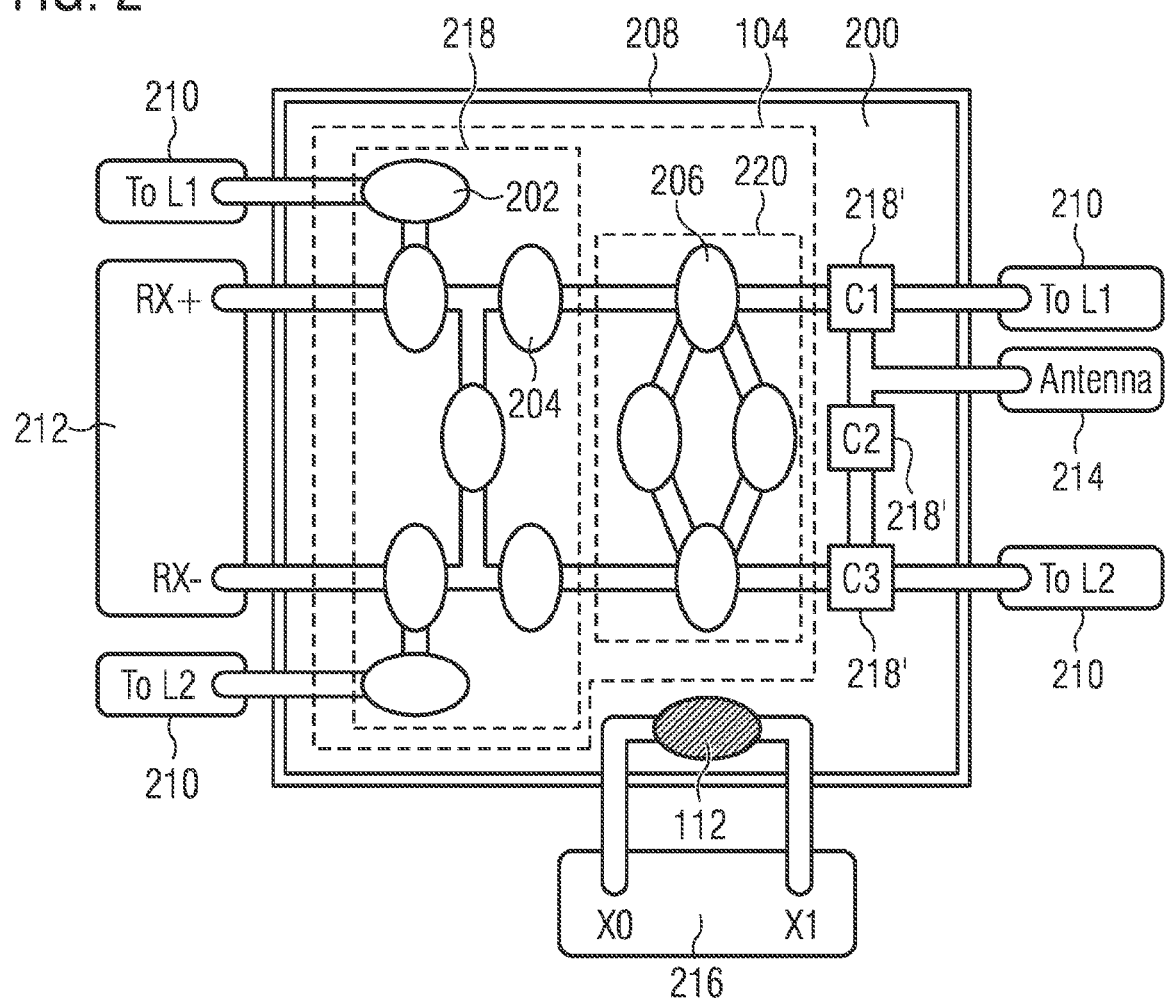
FIG. 2 illustrates a schematic structure of a signal filter and a mechanical resonator.

FIG. 2 illustrates a schematic structure of an example of a signal filter 104 comprising a plurality of mechanical resonators 202, 204, and 206 and a mechanical resonator 112 on a common substrate 200. The substrate 200 is included in a package 208 or housing 208 comprising terminals 210 to connect e.g. inductances or inductors to calibrate or modify a transfer function of the signal filter 104. Signal filter 104 can further comprise or be connected to capacitances 218 on the substrate 200. Package 208 can e.g. be a housing of the electrical device 100. Package 208 further comprises a first signal filter port 212 that can be configured to connect the signal filter 104 to e.g. a transceiver, and a second signal filter port 214 that can be configured to connect the signal filter 104 to e.g. an antenna or a RFEM. Package 208 further comprises a resonator port 216 that can be configured to connect the further mechanical resonator 112 to e.g. an oscillator. Accordingly, electrical terminals of the further mechanical resonator 112 are electrically connected to the resonator port 216. FIG. 2 thus shows a device with a signal filter and oscillator resonator, wherein the signal filter 104 can be a RX BAW filter and the resonator 112 can be an Oscillator BAW resonator. The signal filter 104 can comprise e.g. two parts, a ladder filter structure 218 and a lattice filter structure 220. The presented example could be described as integration of a mechanical resonator or oscillator BAW resonator into a signal filter or RX BAW co-existence filter.

Due to a potential spatial proximity of the further mechanical resonator 112 to the plurality of mechanical resonators of the signal filter 104 which can be a result of the integration of the further mechanical resonator 112 on the substrate of a signal filter 104, in some examples there might be an interference between the respective independent elements, i.e. the signal filter and the further mechanical resonator, e.g. due to leakage effects. This may be the case if the substrate 200 and device 100 are small sized.

Figure 3A:
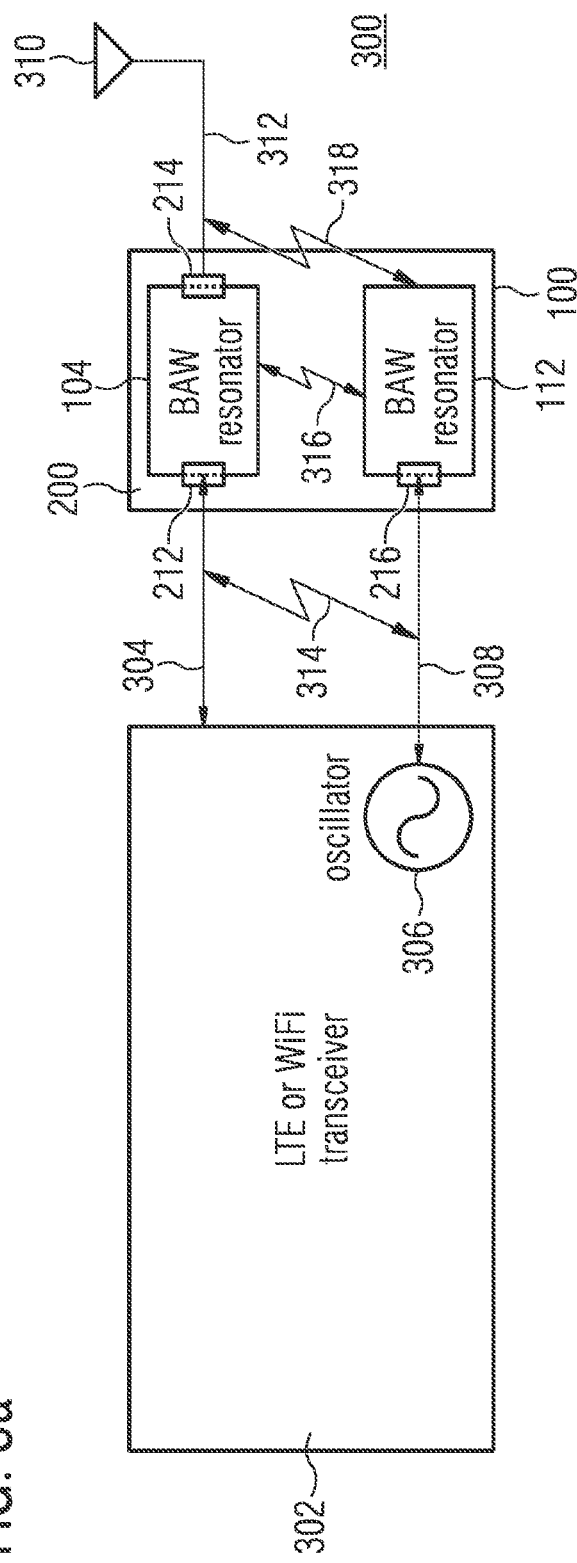
FIG. 3 illustrates an example of an electrical system with an electrical device and a potential leaking effect.
Figure 3B:
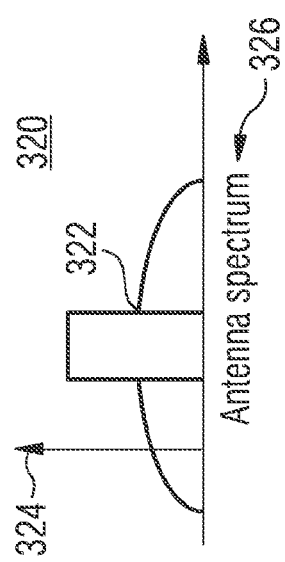

FIG. 3*a* in this context illustrates an example of an electrical system 300 with an electrical device 100 and a potential leaking effect 320, shown in FIG. 3*b*. System 300 comprises a transceiver 302 that is connected to signal filter 104 via a filter connection 304. An oscillator 306 is connected to the further mechanical resonator 112 via an oscillator connection 308. An antenna 310 is connected to a signal filter port of the signal filter 104 via an antenna connection 312. In other words, the filter 104 of electrical device 100 provides a signal path between transceiver 302 and antenna 310 and the further mechanical resonator 112 is an oscillator resonator for the oscillator 306 that is provided e.g. within the transceiver 306. According to the example, no single resonator or BAW resonator as a standalone device is required for the oscillator 306. Thus, a size of system 300 can be reduced by using device 100 in some examples. Also, due to avoiding a standalone oscillator resonator device, manufacturing, testing, packaging and handling cost can be reduced. By contrast, added cost and size by integration of a further mechanical resonator in a substrate of a signal filter could be minor, since the die size, package and handling are almost the same as for only the signal filter.

As a consequence of the achievable small size and thus a close proximity of mechanical resonator 112 to the signal filter 104 there might be a first leakage 314 between oscillator connection 308 and filter connection 304, or a second leakage 316 between the further mechanical resonator 112 and the signal filter 104, or a third leakage 318 between the further mechanical resonator 112 and the antenna connection 312. For example leakage 316 can occur due to propagation of acoustic waves within the substrate 200 that can have the effect of an influence of the further mechanical resonator 112 to one or more of the plurality of mechanical resonators of the signal filter 104.

In FIG. 3*b* a frequency spectrum 322 is shown, which is an exemplary filter spectrum of the signal filter 104 in an antenna spectrum 326 of antenna 310. A frequency signal 324 occurs within the frequency spectrum 322 in an example. The frequency signal 324 can have the frequency of the mechanical resonator 112 that is e.g. the frequency of the oscillator 306, e.g. a LO (local oscillator) frequency. The frequency signal 324 can occur in the antenna spectrum 326 although there is no connection provided between a signal path of the oscillator and a signal path of the antenna due to a leakage 314, 316, or 318. Thus, leakage can in some examples deteriorate a functionality of the device 100 or the system 300 because unwanted frequency signals, e.g. frequency signal 324, can leak into the signal path of the antenna. In other words, integrating an oscillator resonator into a co-existence filter might lead to co-running issues due to on-PCB and/or on-die leakages in device 100 or system 300. This could lead to spectral emissions in a TX (transceiving) mode (LO signal leakage), LO signal phase noise degradation due to TX noise floor and LO signal leakage into the RX (receiving) LNA (low noise amplifier) leading to linearity degradation (IIP2, cross-modulation, etc.). In some examples it might be required to avoid leaking effects between the signal filter and the further mechanical resonator or between their respective signal paths.

Therefore, in some examples, in order to overcome leaking effects while still achieving small size of the electrical device 100, it can be possible that the electrical device 100 further comprises an isolation 114, as shown in FIG. 1. The isolation can be disposed in the substrate or can be positioned on the substrate or be attached to the substrate. The isolation can be configured to avoid leaking effects between the signal filter 104 and the further mechanical resonator 112. Leaking could occur due to electro-magnetic leakage and/or crosstalk and/or due to acoustical leakage between the further mechanical resonator and the plurality of mechanical resonators on the same substrate or a same die. Acoustical leakage might occur due to propagating acoustic waves on acoustic propagation paths in the substrate or the die. Such leakage could occur due to a close distance of the mechanical resonators within the same substrate, i.e. acoustically coupled resonators, and could in some examples deteriorate a functionality of the signal filter and/or the further mechanical resonator respectively. Isolation 114 may ensure that leakage is avoided and a respective functionality does not deteriorate. The isolation 114 can e.g. comprise an acoustical decoupling of the further mechanical resonator 112 from the plurality of mechanical resonators of the signal filter 104. Hence, in some examples of the electrical device 100 the at least one further mechanical resonator is isolated from the signal filter. Isolation can relate to electrical and/or mechanical isolation. Mechanical isolation can relate to acoustical isolation, e.g. an acoustic wave absorbing material can be provided as acoustical isolation.

In some examples, the isolation 114 is configured to attenuate a leakage of a signal from the at least one further mechanical resonator 112 at least into a signal of the signal filter 104. In some examples, alternatively or additionally, the isolation 114 is configured to attenuate a leakage of a signal of the signal filter 104 into a signal of the at least one further mechanical resonator 112.

In other examples it could be possible that two or more further mechanical resonators are provided in the substrate 102. Here, it is possible that all further mechanical resonators 112 are isolated, e.g. acoustically decoupled from the signal filter 104. It is also possible that additionally each further mechanical resonator 112 is isolated from the respective other further mechanical resonators 112. In other words, there might also be a second oscillator resonator, i.e. a second further mechanical resonator 112, which can also be isolated from the first oscillator, i.e. a first further mechanical resonator 112. It can also be possible that if two or more signal filters 104 are provided in the substrate 102 each signal filter 104 can be isolated from each further mechanical resonator 112 and/or from the respective other signal filters 104.

To isolate the further resonator 112, the isolation 114 in some examples is configured to attenuate a leakage of a signal from the further mechanical resonator at least into a signal of the signal filter. The signal can e.g. be an input signal and/or an output signal or an intermediate signal of the signal filter. The isolation 114 is further configured to attenuate a leakage of a signal of the signal filter into a signal of the further mechanical resonator, wherein the signal can also be an input signal and/or an output signal. In other words, the isolation 114 can work bidirectional. The attenuation can comprise a complete attenuation of a leaking signal and/or an attenuation to a level that a respective function of the signal filter or the further mechanical resonator does not deteriorate despite of the leaking signal.

Examples thus show how an integration of a high-Q resonator, namely the further mechanical resonator, into a signal filter, e.g. a coexistence filter, can be provided while at the same time ensuring proper operation and co-running of both components, i.e. the signal filter and the further mechanical resonator, on the same die, i.e. avoiding leakage effects that could lead to deterioration of a functionality of one of the components. An effect can be the possibility to generate a very low phase noise LO (local oscillator) signal, improving an EVM (error vector magnitude) of both a transmitter and a receiver or the transceiver. Providing the electrical device 100 in a system can lead to the described effects while at the same time reducing size and costs.

Figure 4:
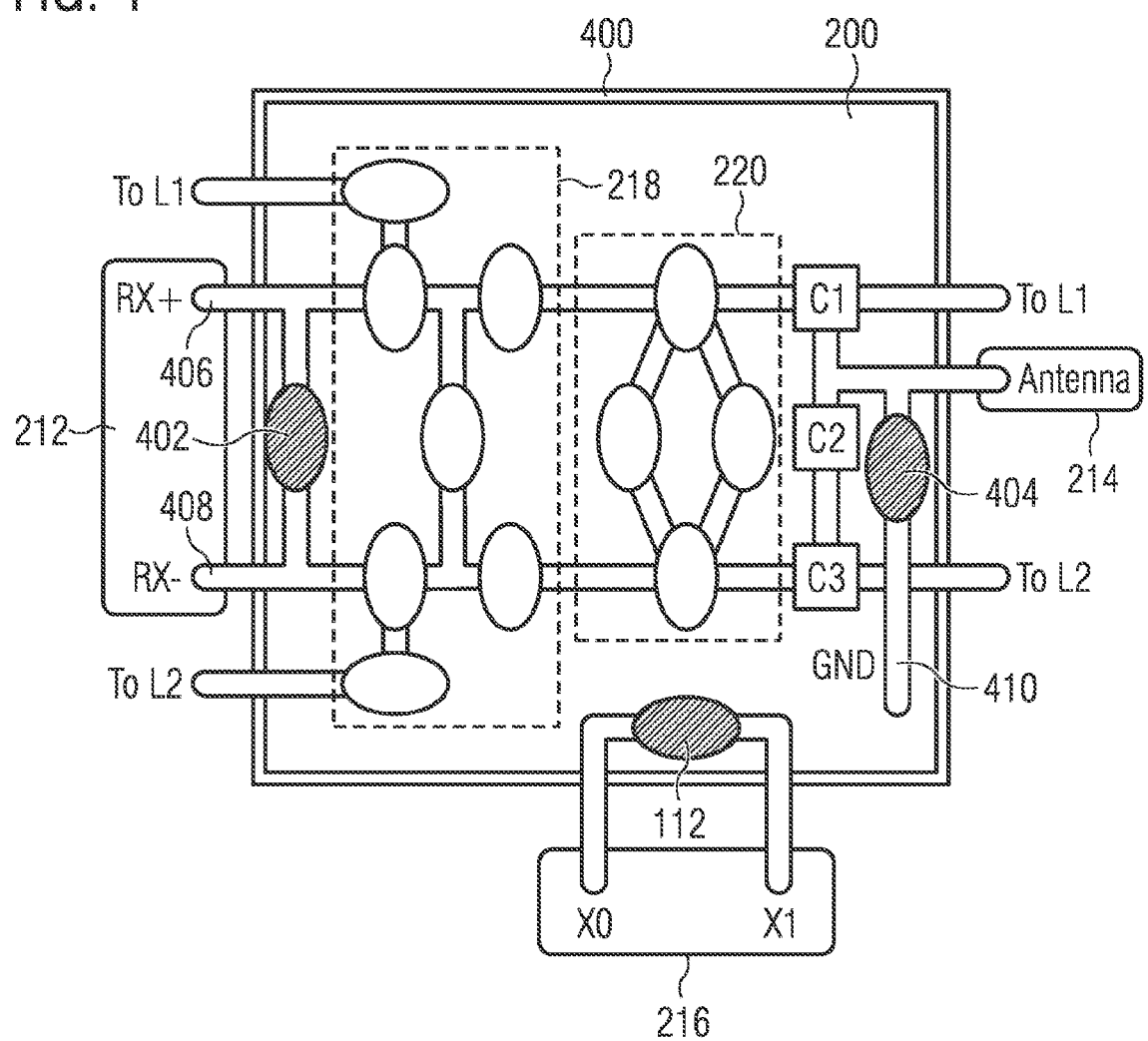
FIG. 4 illustrates a schematic structure of an electrical device comprising an isolation.

FIG. 4 illustrates a schematic structure of an example of an electrical device 400 comprising an isolation. The electrical device 400 can be based on the electrical device of FIG. 2 comprising substrate 200. Therefore, the description of electrical device 400 has a focus on the additional isolation that is provided to avoid leaking effects. The isolation of electrical device 400 is provided by a mechanical resonator 402 and/or by a mechanical resonator 404. Mechanical resonator 402 is provided at the first signal filter port 212, or more exactly, between a first terminal 406 and a second terminal 408 of the first signal filter port 212. Mechanical resonator 402 is provided between the first signal filter port 212 and the ladder filter structure 218. Mechanical resonator 402 thus does not provide a functionality of the signal filter 104 but is provided for the isolation, i.e. for avoiding e.g. a leaking oscillator signal into the signal filter path. For this purpose, mechanical resonator 402 can have a same resonance frequency or fundamental frequency as the further mechanical resonator 112. In other words, an electrical impedance of the mechanical resonator 402 is configured to be small, for example close to zero, for a frequency of a oscillator signal at mechanical resonator 112 or resonator port 216. In consequence, frequency signals at this specific frequency cannot pass the mechanical resonator 402, i.e. they cannot enter the signal path in the signal filter 104 or cannot be emitted from the signal filter 104 to the first signal filter port 212. The mechanical resonator 402 can thus be described as an input trap for signals with oscillator frequency as it traps these signals due to its short circuit impedance at the respective reference frequency. For this purpose, the resonator 402 can equal the further mechanical resonator 112. By providing a further mechanical resonator 402 it thus can be possible to avoid or minimize leaking effects with only minor additional costs as providing a further mechanical resonator to an already existing plurality of mechanical resonators can be achieved with little additional effort.

The electrical device 400 can comprise the further additional mechanical resonator 404 in the substrate 200 connected to the second signal filter port 214 of the signal filter 104, wherein a resonance frequency of the additional mechanical resonator 404 is at the reference frequency, i.e. the fundamental frequency of the mechanical resonator 112. The mechanical resonator 404 can work in the same way as mechanical resonator 402 as isolation and can be described as output trap in analogy to the before described input trap. This means, that also mechanical resonator 402 can show minimum impedance at a frequency of the oscillating signal or a signal from a signal path that comprises the further mechanical resonator 112. Therefore, it traps all such signals, i.e. potential leaking signals, such that they do not show an effect on a functionality of signal filter 104. Mechanical resonator 404 can be provided between the second signal filter port 214 and an electrical ground 410 or ground terminal.

Therefore, all signals at a frequency of the mechanical resonator 404, i.e. the reference frequency provided by mechanical resonator 112, are lead to ground instead of e.g. being transmitted to an antenna connected to the second signal filter port 214.

In some examples an electrical device may comprise a mechanical resonator 402 according to the previous description as an input trap, i.e. for isolation of leaking signals from the further mechanical resonator 112. In other examples an electrical device may comprise a mechanical resonator 404 according to the previous description as an output trap, i.e. for isolation of leaking signals from the further mechanical resonator 112 as well. In other words in some examples one additional mechanical resonator 402, 404 may provide sufficient isolation, e.g. if a specific application is robust against minor leaking and/or if for example further isolation is provided as is possible by an acoustic isolation as described below.

For the purpose of isolation it can be useful to provide further mechanical resonators 402, 404 to avoid leakage. It may be a straight forward approach to use such mechanical resonators, because they are anyway provided, i.e. fabricated, in an electrical device 400, e.g. during a BAW manufacturing process for providing the other mechanical resonators of device 400, which may be achieved at lower costs than e.g. acquiring external components as isolation. However, it is also possible that in other examples components that differ from mechanical resonators are provided as input trap or output trap and thus as isolation against leaking effects.

In some examples, the electrical device 400 comprises other elements, e.g. resonating elements, than the mechanical resonators 402, 404. These other resonating elements can provide at least one additional signal path connected to at least one port of the signal filter, for example at a same position as the mechanical resonators 402, 404 in previous examples. The signal path comprises a reciprocal notch filter with a pass frequency at the reference frequency which can be achieved by providing a respective resonating element. Such resonating element e.g. can be a dielectric resonator, or a transmission line resonator.

In examples it is thus possible that isolation structures are added, e.g. into the BAW die or substrate 200. FIG. 4 presents an example of input and output leakage traps. These are actually mechanical resonators, e.g. BAW resonators that present very low impedance at the input of the transceiver ports or first signal filter port 212 or RX ports and the antenna ports or second signal filter port 214 exactly at the oscillator frequency. Therefore an oscillator leakage can be attenuated at the ports of the signal filter 104, i.e. the antenna port and the RX port. The same principle can be used on the TX port, attenuation, the noise floor of the TX on the oscillator frequency band.

Figure 5:
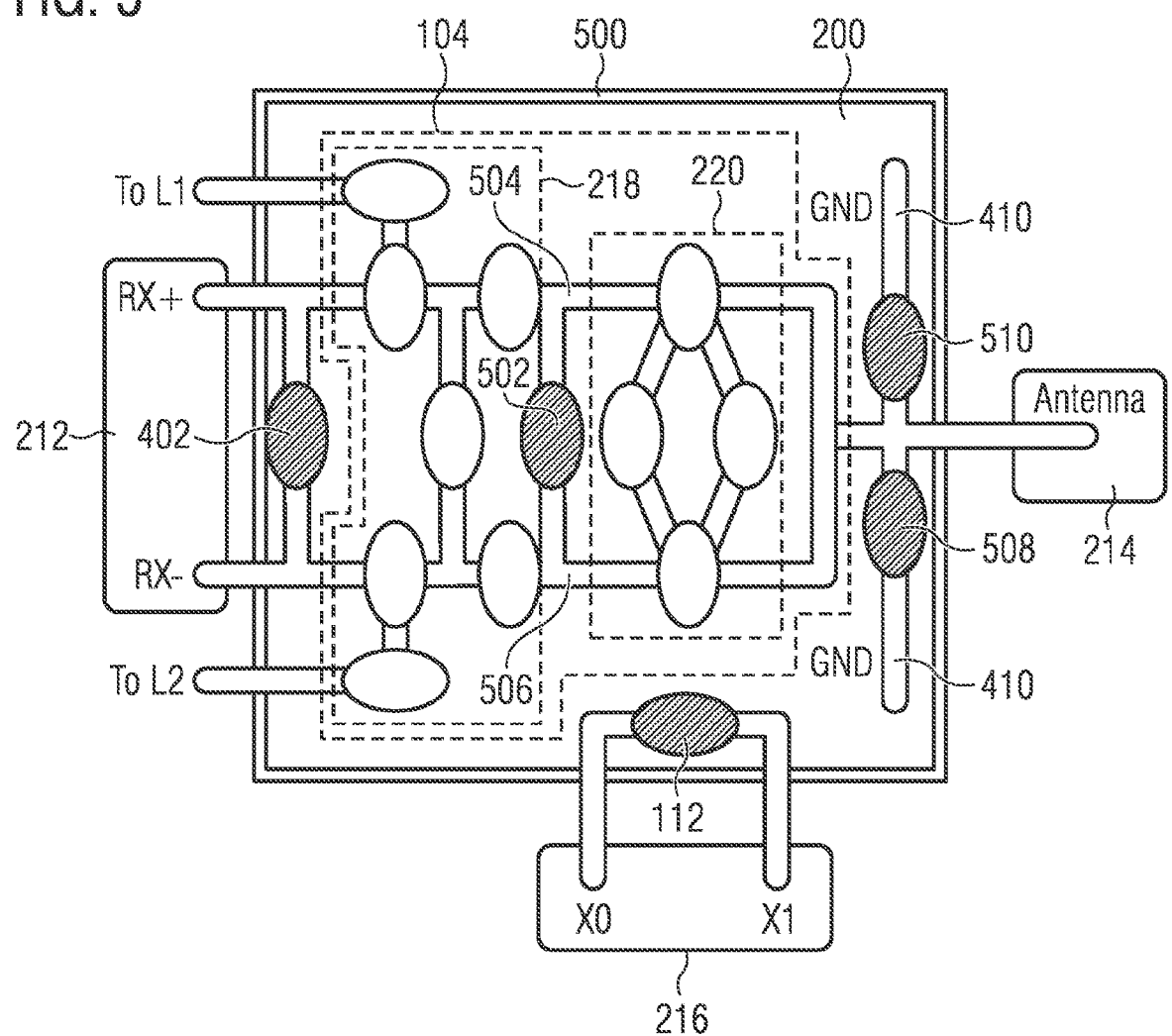
FIG. 5 illustrates a schematic structure of an electrical device with a symmetrical design, the electrical device comprising an isolation.

FIG. 5 illustrates a schematic symmetrical structure of an electrical device 500 comprising an isolation. The isolation is basically provided by principles described before when describing the input or output traps provided by mechanical resonators 402, 404. In electrical device 500, as in electrical device 400 a mechanical resonator 402 is provided as input trap. The signal filter 104 comprises at least one additional mechanical resonator 502 in the substrate as isolation, the additional mechanical resonator 502 connecting a positive branch 504 and a negative branch 506 of the signal filter 104, the signal filter being configured for differential signal processing. The mechanical resonator 502 shows a same functionality as mechanical resonators 402, 404, i.e. it traps leaking signals coming into the signal filter 104 from an oscillator for example via the first signal filter port 212 or from the mechanical resonator 112 via the substrate 102 if the leaking signal has a frequency which corresponds to a fundamental frequency of the mechanical resonator 502. Therefore, as mechanical resonators 402, 404, the mechanical resonator 502 can equal the mechanical resonator 112, i.e. have a same resonance frequency which equals the reference frequency or a corresponding oscillator frequency. Adding mechanical resonator 502 into the signal path can further reduce leaking effects and thus enable a further reduction of the size of electrical device 500 in some examples.

In contrast to electrical device 400, an output trap in electrical device 500 is provided symmetrically by mechanical resonators 508, 510, that are both connected to ground 410. Mechanical resonators 508, 510 can according to mechanical resonator 502 equal mechanical resonator 112, i.e. have a same resonance frequency which equals the reference frequency or a corresponding oscillator frequency and thus leads to impedances required for the purpose of isolation. Electrical device 500 thus presents additional implementation of leakage traps. Symmetrical implementation and nested design might help even more achieving the required isolation and thus might make it possible to further reduce a size of an electrical device while maintaining a proper functionality of signal filter 104 and an oscillator using mechanical resonator 112. Some examples comprise only a mechanical resonator 502 but no input/output traps, e.g. if enough isolation can already be provided by only mechanical resonator 502.

Some examples relate to an isolation due to an acoustical decoupling of the further mechanical resonator 112 from the plurality of mechanical resonators of the signal filter 104. As all isolation techniques described herein, the acoustic decoupling can be combined with any other isolation technique of other examples. For purpose of acoustical decoupling an orientation of the further mechanical resonator 112 can be adjusted such that an acoustic wave that might be emitted from the further mechanical resonator 112 into the substrate does not propagate in a direction of the signal filter or a mechanical resonator of the signal filter. A mechanical resonator can have a predefined direction in that an emission of acoustic waves can be a maximum. In other words, mechanical resonators due to their coupling to the substrate can emit acoustical energy from a respective oscillation of the resonator into the substrate as leaking acoustic waves with a maximum emission into the predefined direction. In some examples the predefined direction can be two opposite direction, i.e. two directions at an angle of 180° or it can be for directions, each offset by 90°, e.g. if a geometry of the mechanical resonator is rectangular. Thus, due to the orientation a direction of a acoustic wave propagating in the substrate can be determined. Leaking effects can be reduced if an acoustic wave emitted from the further mechanical resonator 112 does not impinge on the signal filter 104 or its respective mechanical resonators but passes them by.

With respect to FIG. 2, FIG. 4 and FIG. 5 a described decoupling could be achieved because e.g. the orientation of the respective further mechanical resonator 112 is different in some examples, e.g. different from the orientation of another mechanical resonator. Therefore, the further mechanical resonator 112 might be rotated in the plane of the substrate 102, 200. It is also possible that the mechanical resonators of the plurality of mechanical resonators are rotated. It can also or additionally be possible that the further resonator is positioned at a corner of the substrate while the signal filter is at another corner, such that emitted acoustical waves from the further mechanical resonator 112 do not hit the mechanical resonators of the signal filter.

In some examples an orientation of the further mechanical resonator 112 is different from an orientation of at least one mechanical resonator 106 of the plurality of mechanical resonators 106, 108, 110. If for example the mechanical resonators of the signal filter 104 have different orientations, the further mechanical resonator 112 can have a different orientation from the closest mechanical resonator of the signal filter. Because an energy of an acoustic wave can decrease in the substrate do to damping effects a leaking effect can be reduced if an emitting wave does not hit the closest mechanical resonator of the plurality of resonators directly.

Other examples relate to an electrical device wherein an orientation of the further mechanical resonator 112 is different from an orientation of at least 50% of the mechanical resonators of the plurality of mechanical resonators of the filter. This could further reduce leaking effects because it can be possible that less mechanical resonators of the signal filter are impacted by potentially emitted acoustical waves from the further mechanical resonator 112.

In some examples, an orientation angle of the at least one further mechanical resonator 112 differs about more than 20 degrees from an orientation angle of one mechanical resonator of the plurality of mechanical resonators. It can also be possible that the orientation differs about 45 degrees or 90 degrees. An orientation angle can depend on an individual design of e.g. the signal filter on the substrate, i.e. respective positions of the plurality of mechanical resonators, and the position of the further mechanical resonator 112 on the substrate. An orientation angel can be adjusted in a way that a minimum number of mechanical resonators are within the predefined direction of the further mechanical resonator 112.

In some examples it might be possible to make use of a polarization of a mechanical (and possibly electrical) wave on the substrate. Propagating waves may have a polarization, so by turning a resonator, i.e. changing its orientation, it can be isolated from a polarized wave. This can be the case for electrical waves as well as some kinds of acoustical waves in the substrate. For example, ultrasound waves also may have a lateral component, and thus show polarizations as well. Furthermore, an acoustic wave may be traveling in a direction and thus excite the two terminals of a mechanical resonator with finite dimensions at slightly different times. The time difference can depend on the orientation and can be minimized by placing the device orthogonal to the travel direction of the wave. This may reduce the impact of the traveling wave onto a mechanical resonator, e.g. the oscillator resonator or one of the resonators of the signal filter 104. The oscillator resonator, i.e. further mechanical resonator 112, itself may also be more susceptible for waves traversing it in one direction compared to another direction, typically depending on whether the intended vibrations of the oscillator resonator are aligned with the disturbing waves or orthogonal to them and this again depends on the orientation on the substrate and the direction of the disturbing waves. Same may hold for resonators used in filters and oscillators. Basically best orientation of a mechanical resonator can be determined in a way where it is least susceptible to the electric or mechanical waves from a respective aggressor, i.e. a mechanical resonator that is emitting waves, or to the combined effect of mechanical and electromagnetic waves. E.g. at some angle of placement the effect of the mechanical and electromagnetic waves may cancel out each other due to a phase shift around 180 degrees between them.

Further examples relate to an acoustical decoupling of the further mechanical resonator 112 and the signal filter 104, or its mechanical resonators respectively, by providing an acoustic isolation structure. The acoustic isolation can be disposed in the substrate or attached to the substrate, e.g. the acoustic isolation can be provided on a surface of the substrate. An acoustic isolation structure is configured to attenuate an acoustical wave propagation through the substrate between the further mechanical resonator to the signal filter. As consequence of the attenuation, a leaking effect can be reduced because acoustically leaking energy may not have a high impact on the functionality of the signal filter and/or the further mechanical resonator.

Figure 6:
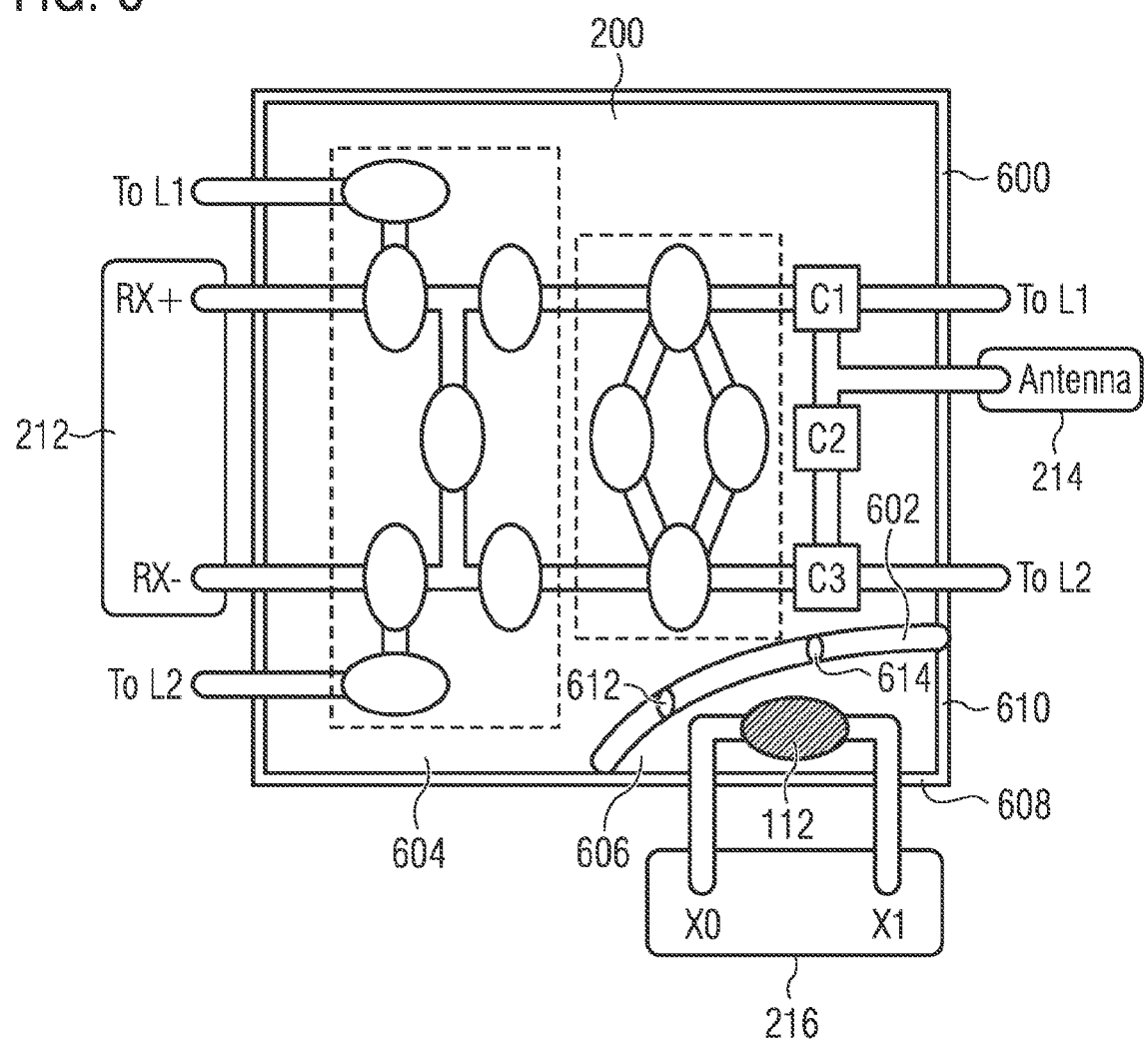
FIG. 6 illustrates a schematic structure of an electrical device comprising an acoustic isolation.

FIG. 6 in this context illustrates a schematic structure of an electrical device 600 comprising an acoustic isolation 602. Isolation 602 separates the substrate 200 in a first part 604 on which the signal filter 104 can be provided and a second part 606 on which the further mechanical resonator 112 can be provided. The acoustic isolation 602 can reach from a first edge 608 of substrate 200, or first part 606 respectively, to a second edge 610 of substrate 200, or second part 606 respectively. In some examples it is possible that the acoustic isolation 602 reaches from the first edge 608 to a first position 612 or to a second position 614, i.e. the acoustical isolation 602 does not necessarily reach completely from first edge 608 to second edge 610. In other examples it is possible that the acoustic isolation 602 does not reach to an edge of the substrate 200 but reaches e.g. from first position 612 to second position 614. In other words, the acoustical isolation 602 provides an option or additional option to improve the isolation by adding a special dedicated isolation structure. Concerning BAW resonators for example it can be that the acoustic isolation structure would improve the isolation between the co-existence filter and the oscillator resonator. In the following, different examples of acoustic isolation 602 are described.

Figure 7:
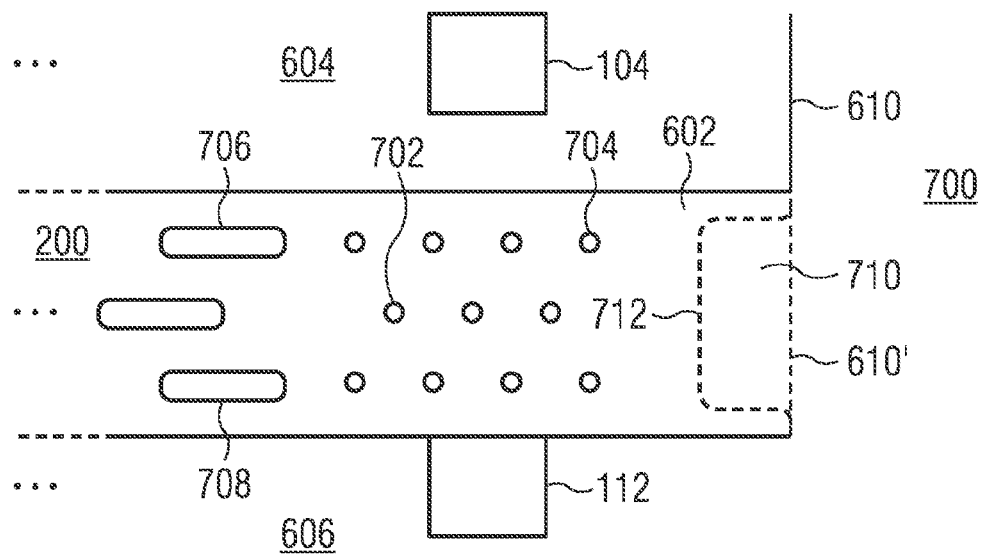
FIG. 7 illustrates schematically an example of an acoustic isolation comprising holes.

FIG. 7 illustrates an example 700 of an acoustic isolation 602 comprising holes 702, 704.

The holes are provided in part of substrate 200 that defines at least a part of the acoustic isolation 602. A further part of acoustic isolation 602 e.g. can comprise trenches 706, 708. Yet another part of acoustic isolation 602 can comprise a cut 710. A hole or trench can be a deepening in the substrate 200 or can completely go through the substrate 200 vertically. Holes and trenches can be provided mechanically, e.g. by drilling, or can be provided by etching processes that remove parts of the substrate material of substrate 200. Holes can e.g. show a specific geometry, i.e. a predefined diameter which might depend from a distance between the holes. The holes can be provided uniformly distributed, for example in a square pattern or in a hexagonal pattern with predefined pattern parameters that define distances between two or more holes. A trench can be provided in a same way, wherein the specific geometry e.g. can comprise a length and a width of a trench. A cut can be provided by removing material from an edge 608, 610 from the substrate. For example by the cut 710 the edge 610' is removed and a new edge 712 forms an edge of the acoustic isolation 602. Also a cut comprises a predefined width and/or length and/or depth of the cut which can determine a degree of isolation.

The holes or trenches can reduce acoustic coupling between the part 604 and part 606 such that leaking effects due to leaking acoustic waves propagating in the substrate from e.g. further mechanical resonator 112 to the signal filter 104 or vice versa can be reduced. The holes or trenches can provide a gas, e.g. air, or vacuum, or if the substrate is packaged a package material instead of the substrate material. The material change between the substrate and the holes or trenches can lead to a specific acoustic reflection factor. It can have the effect that an acoustic wave travelling to e.g. a hole and hitting a respective material border at the hole is reflected. Thus, the acoustic wave may not be able to pass the acoustic isolation 602 or only a fraction of the acoustic wave energy may pass the acoustic isolation 602 such that leaking effects due to acoustic leakage could be reduced.

The acoustic isolation 602 of example 700 thus comprises at least one cut 710, a trench 706, 708 and a plurality of holes 702, 704 in the substrate 200 between the signal filter 104 and the further mechanical resonator 112. In other examples other combinations of cuts, trenches and/or holes are possible. It could for example be possible that two cuts 710 are provided from two edges 608, 610 such that only a part of substrate 200 remains within the acoustic isolation 602. The part can be small such that only a fraction of a potential leaking acoustic signal can pass it or the part can be e.g. out of a maximum emission direction of the further mechanical resonator 112 due to a specific orientation of the further mechanical resonator 112. It is possible to fill the holes or trenches with a different material, e.g. a different semiconductor material to provide a material border with a specific acoustical reflection factor. The effect may be further reduction of acoustical leaking due to a higher specific acoustical reflection factor. In some examples it is possible that a material in the holes provides an acoustic dampening of acoustic waves.

Figure 8:
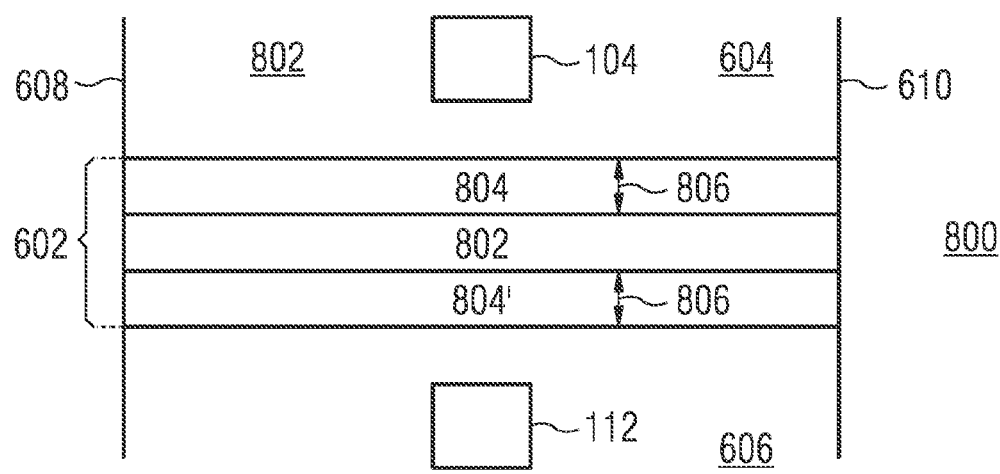
FIG. 8 illustrates schematically an example of an acoustic isolation comprising a material different from a substrate material.

FIG. 8 illustrates an example 800 of an acoustic isolation 602 comprising a different material 804 different from a substrate material 802. In the example 800 the material 804 can reach from edge 608 to edge 610, i.e. reaching continuously through the substrate 200 to separate the part 604 with signal filter 104 from part 606 with further mechanical resonator 112. The materials 802 and 804 can differ from each other with respect to their density and/or their stiffness that can be described by their bulk modulus. For example, acoustic waves can be reflected by a solid surface, so material 804 can be more solid than material 802 such that a wave emitted e.g. from further resonator 112 is reflected back to part 606 instead of propagating through the acoustic isolation 602 into the part 604.

It can be possible that multiple different materials 804 are used, each of the materials 804 differing from material 802 of substrate 200. For example it is possible to increase a frequency band within that arriving acoustic waves can be reflected, thus an isolation can be improved and leaking can be decreased. It is also possible that several layers of the material 804 are provided in the acoustic isolation 602, each layer having for example a width 806. The width 806 can depend on a wavelength of the propagating wave. For example, the further mechanical resonator 112 can have a fundamental frequency which might lead to emitted acoustic waves at that fundamental frequency. The material 804 provides a specific propagation speed of acoustic waves depending on the material 804. Depending on the specific propagation speed and the fundamental frequency a wavelength of the propagating wave within the material 804 can be determined. It is possible that the width 806 equals this determined wavelength or is a half or quarter of the determined wavelength or is a multiple of the wavelength. With material 802 layers between the layers of material 804 it can be possible to create an acoustic Bragg-reflector that can increase a reflection factor and thus increase an isolation of the acoustic isolation 602. Thus, leaking effects could be further reduced. Such acoustic Bragg-reflector or alternatively one layer of the different material can reach continuously from one part of an edge of the substrate to another part of an edge of the substrate, being positioned between the further mechanical resonator and the signal filter.

In other examples, however, the different material 804 is attached non-continuously within an area between the further mechanical resonator 112 and the signal filter 104. This can for example be the case if the holes 702, 704 or trenches 706, 708 are filled with material 804 or if the different material 804 is e.g. added on the respective positions where holes 702, 704 or trenches 706, 708 could be otherwise provided.

Figure 9:
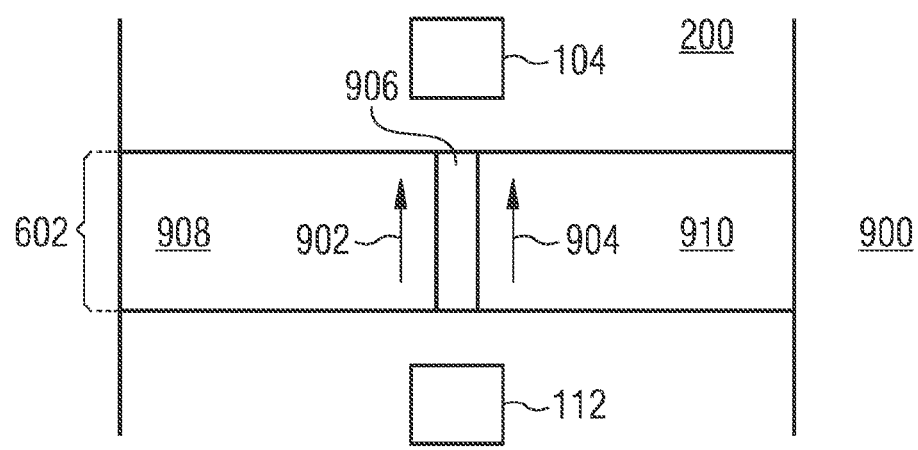
FIG. 9 illustrates schematically an example of an acoustic isolation comprising two acoustical propagation paths.

FIG. 9 illustrates an example 900 of an acoustic isolation 602 comprising two acoustical propagation paths 902, 904. The purpose of providing several acoustical propagation paths for the acoustic waves can be to provide a respective phase shift between them with respect to a propagating acoustic wave. This may cause destructive interference, e.g. the two acoustical propagation paths 902, 904 may have a phase shift of 180 degrees, i.e. half a wavelength difference. An acoustic wave entering the acoustical propagation paths 902, 904 at one end could be canceled at the other end of acoustical propagation paths 902, 904 due to destructive interference. The acoustical propagation paths 902, 904 can be separated by a separation 906, e.g. a trench or a part comprising a different material, e.g. a material that reflects acoustical waves as described above.

The respective phase shift or phase difference could be achieved by changing the acoustic properties (speed of waves) on one propagation path or both propagation path compared to e.g. the acoustic properties of substrate 200. It is e.g. possible to make a material 908, 910 of path 902, 904 stiffer/softer or lighter/heavier in order to increase/decrease a wave speed of the respective path. Making a material stiffer/softer may comprise adding a stiffer or softer or heavier or lighter material to the substrate and/or cut away part of the substrate and/or cut holes that can be filled or covered by the stiffer/softer material. It should be noted that this attached device may be a dedicated part, but it may also be a part that is anyhow needed in the design of the electrical device 100 e.g. a strategically placed other mechanical resonator of signal filter 104 or a capacitor of signal filter 104.

Thus, in some examples due to different materials 908, 910 at least two different acoustic wave propagation paths between the signal filter 104 and the further mechanical resonator 112 are provided, wherein at least one of the two paths, e.g. path 904, is configured to cause a phase shift of a propagating acoustic wave on said path 902 to effect a destructive interference with an acoustic wave propagating along another path 904. It can thus be possible that only material 908 is different from a material of substrate 200 or that only a wave speed of path 902 differs from a wave speed in the substrate 200 whereas the material 910 equals the material of substrate 200 and the wave speed of path 904 equals the speed wave of substrate 200. This might have the effect to provide an efficient or economical acoustic isolation 602 as only the wave speed of propagation path 902 is altered, e.g. by adding material 908 or replacing respective substrate material by material 908.

In other examples both propagation paths 902, 904 comprise a material 908, 910 that differs from a material of substrate 200. Material 908 has a predefined material property that is different from the material 910 of another path, i.e. path 904, to provide a different propagation speed of acoustic waves compared to the other path, i.e. path 902. The different paths may be separated by holes, which could make it easier to analyze the paths as the distinct paths are obvious.

However, separating as done by separation 906 is not necessary in other examples, e.g. a few stiffeners spread along the acoustic isolation 602 can achieve enough isolation there. In other words, a separation 906 is not obligatory in some examples to separate the two propagation paths 902, 904.

Instead of altering acoustic properties, there may be further other ways of providing, additionally to or independently from the previous examples, a phase shift between different propagation paths.

Figure 10A:
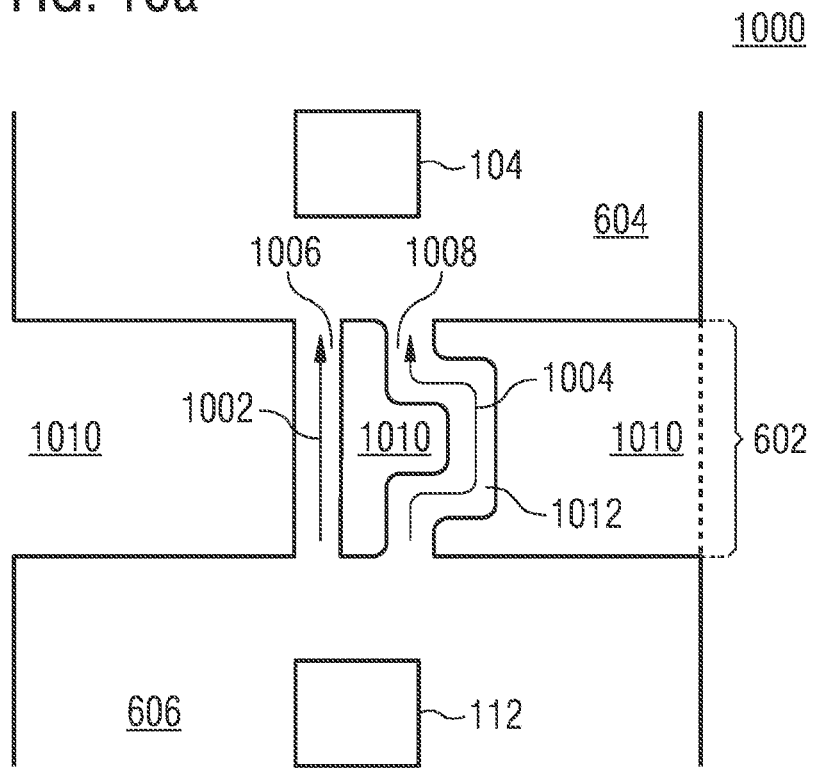
FIG. 10 illustrates schematically an example of an acoustic isolation comprising acoustical propagation paths of different lengths.
Figure 10B:
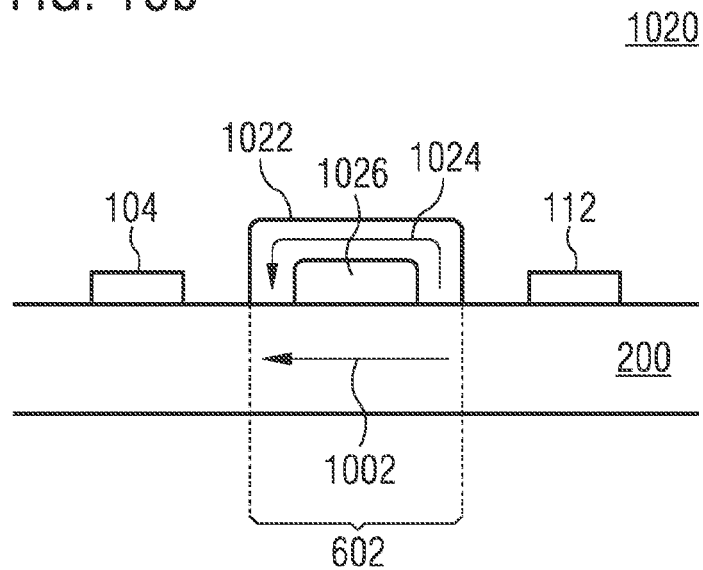

FIG. 10 illustrates examples 1000 (shown in FIG. 10*a*) and 1020 (shown in FIG. 10*b*) of an acoustic isolation 602 comprising acoustical propagation paths of different lengths, that means different physical lengths. In these examples, at least one of the two paths is longer than another path. The different length of the paths may have the effect that it may not be necessary to alter a material or a material property at one path while still achieving a phase shift between the paths. Instead, it can be possible that all different paths comprise a same material that can be the same material as comprised in substrate 200.

For providing paths of different lengths it can be possible to cut away material, e.g. of the substrate 200 within the acoustic isolation 602, in order to have two (or more) bridges or connections (meanders) between part 604 and 606, but have one meander, this is remaining part of e.g. substrate material, to have a longer way to achieve the phase difference.

FIG. 10*a* illustrates in example 1000 an acoustic isolation 602 with a first propagation path 1002 that is shorter than a second propagation path 1004. A first bridge 1006 and second bridge 1008 with a meander may be provided by having removed substrate material from substrate parts 1010. The bridges 1006, 1008 connect parts 604, 606 and establish acoustic propagation paths 1002, 1004. Bridge 1006 is straight which leads to a direct, i.e. the shortest possible connection between part 604 and part 606. In contrast, bridge 1008 is formed curvy or angular, e.g. due to a semi-circle like element 1012 of bridge 1008. The curvy or angular forming has the effect that propagation path 1004 is longer than propagation path 1002. The difference in length can be adjusted to achieve a phase difference of e.g. 180 degrees between acoustic waves travelling along the two paths 1002, 1004. Therefore, the length of path 1004 can be the length of path 1002 plus half a wavelength of a respective acoustic wave. The length can also be set to achieve a phase difference of 180 degrees+n×360 degrees, n being an integer. This can lead to a destructive interference of a wave travelling along the two paths 1002, 1004, thus an attenuation or isolation can be achieved and leaking effects can be reduced.

FIG. 10*b* illustrates another possibility to provide propagation paths of different lengths. In example 1020, a further structure 1022 is added to the substrate 200 that is shown in a cross section in FIG. 10*b*. Structure 1022 provides a further propagation path 1024 that is longer than propagation path 1002 which leads through the substrate 200. Structure 1022 can be described as a bridge which provides the second path that can be separated partly from the substrate 200 by a separation 1026, e.g. a cavity between substrate 200 and structure 1022. Structure 1022 is e.g. a metallic or ceramic part attached to the substrate 200. The difference of paths 1002 and 1024 can be determined as in example of FIG. 10*a* to achieve destructive interference of an acoustic wave propagating along the paths 1002, 1024, to increase isolation and reduce leaking effects.

A further example relates to an isolation or reduction of leaking effects due to different frequencies of the further mechanical resonator 112 and the signal filter 104. A spectral separation between the oscillator, i.e. a frequency of the further mechanical resonator 112, and TX/RX frequency and their harmonics, i.e. frequencies of the further mechanical resonator 112, can have the effect that a leaking signal does not deteriorate the functionality of the respective component. In one example a filter band of signal filter 104 may reach from 2,100 MHz to 2,140 MHz while the fundamental frequency of the further mechanical resonator 112 may be at 800 MHz for example. This has the effect that neither the fundamental frequency of 800 MHz nor higher harmonics of the fundamental frequency (1600 MHz, 2400 MHz) may show any impact on the functionality of signal filter 104. Thus, effects occurring due to leaking effects between signal filter 104 and the further mechanical resonator 112 can be reduced or avoided.

In previous examples presented up to here, the electrical device 100 comprises passive components or passive elements exclusively. In other words, the electrical device 100 may be a passive electrical device. However, in other examples, electrical device 100 also comprises at least one active electrical component, the substrate 102 and the active electrical component being disposed within a common package. This may have the effect that for example an integral oscillator may be provided within electrical device 100, the oscillator using the further mechanical resonator 112 as oscillator resonator. Another active electrical component may be a LNA (low noise amplifier). Providing the LNA within a same housing as the signal filter 104 may have the effect that due to a minimized distance between the components some disturbing effects may be avoided and for example a signal quality may be improved.

Providing both a signal filter 104 and a further mechanical resonator 112 in a substrate 102 may reduce a size and costs of electrical device 100 compared to standalone components.

Using or providing device 100 in an electrical system as a result may reduce size and costs of the electrical system as well. Thus, some examples relate to electrical systems that comprise at least one electrical device 100.

Figure 11:
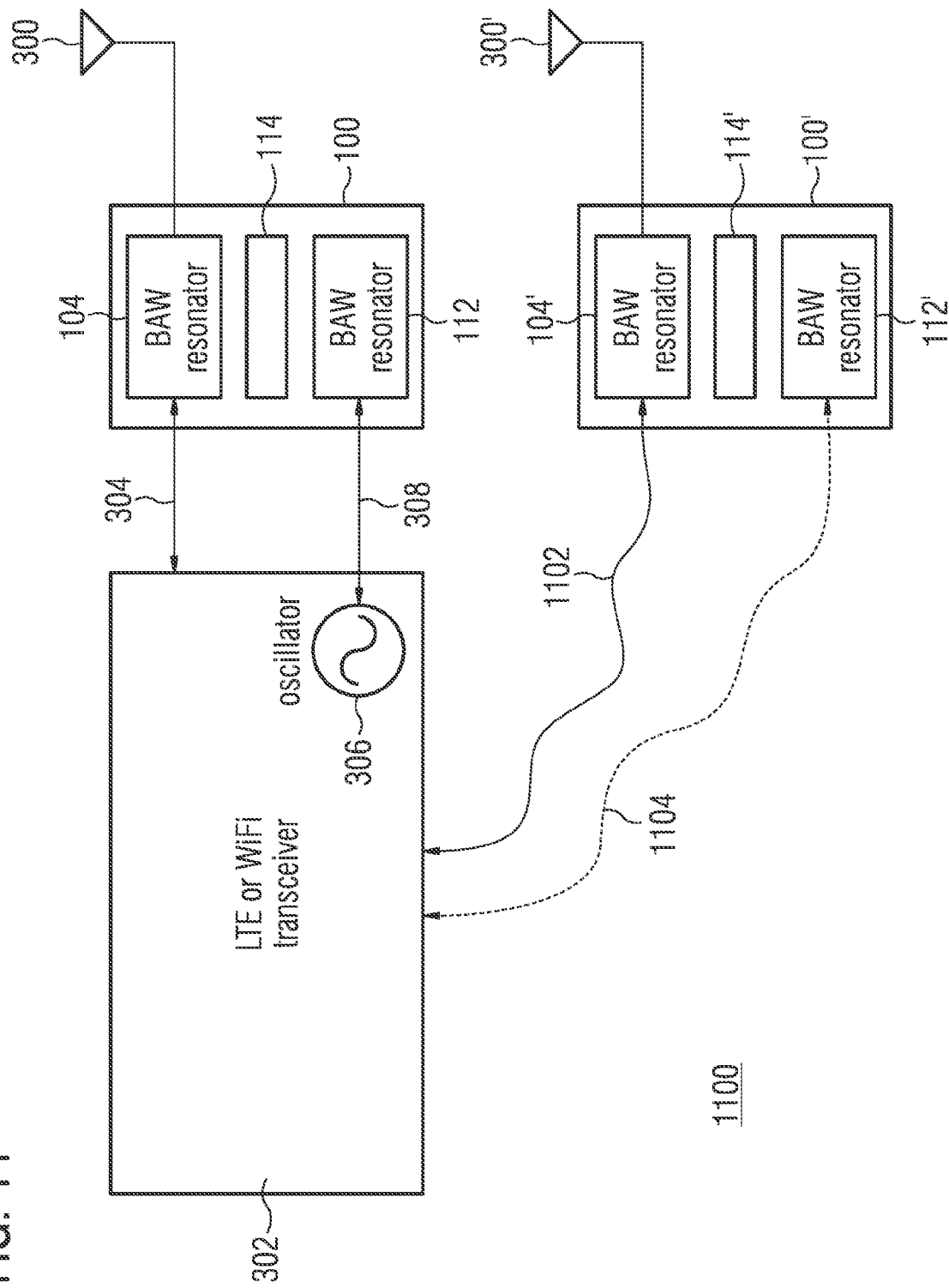
FIG. 11 illustrates an example of an electrical system with two electrical devices.

FIG. 11 illustrates an example of an electrical system 1100 with two electrical devices 100, 100'. The electrical system 1100 is based on electrical system 300 of FIG. 3 and a focus of the following description is set on the additional elements of electrical system 1100 compared to system 300. Electrical system 1100 comprises two antennas 300, 300' that can be for example used for different radio standards. E.g. one antenna can be a LTE-antenna while the other antenna can be a WiFi-antenna. The electrical components 100, 100' comprise an isolation 114, 114' to avoid leaking effects. While signal filter 104 is connected to the transceiver 302 by the filter connection 304, signal filter 104' is connected to the transceiver 302 by a long filter connection 1102. The long filter connection 1102 is longer than filter connection 304, i.e. a therefore provided electrical line or conducting element is longer. This can have the effect that electrical device 100' can be positioned farer from transceiver 302 than electrical device 100. Accordingly, to connect mechanical resonator 112' to transceiver 302, e.g. to provide a reference signal for the oscillator 306, a long resonator connection 1104 could be provided.

It is possible that as shown in FIG. 11 the transceiver 302 requires only one external resonator for its oscillator 306. This external resonator is provided by the further mechanical resonator 112 of device 100 which is connected via resonator connection 308. This may have the effect that due to the shorter resonator connection 308 an external impact or disturbances on the oscillator signal or functionality of oscillator 306 can be minimized. In some examples only one oscillator might be required such that the mechanical resonator 112' may be in a stand-by mode or not connected to the transceiver 302. For example, if two substrates 102, 102' are provided, the oscillator resonator, i.e. mechanical resonator 112 in this example, on the one substrate closer to the TRX (transceiver), i.e. substrate 102 in this example, is connected via resonator connection 308 and used by oscillator 306. By contrast, mechanical resonator 112' could be unused in this example. In other examples, transceiver 302 could provide two oscillators (not shown) such that a second oscillator may use mechanical resonator 112' as external resonator. This may be possible if for example a reference frequency of resonator 112' is set in a way that no disturbances occur although using the long resonator connection 1104. Such system could thus comprise two independent oscillators without increasing a system size or system costs.

If a system comprises two oscillators, it is also possible that the oscillators use a mechanical resonator of a device 100, 100' which is currently in an idle substrate with respect to its respective signal filter 104. In other words, it is possible that only one signal filter of a system with two signal filters is used by transceiver 302. For example a signal is sent to antenna 300 via signal filter 104 and antenna 300' is temporary unused. Then, two oscillators 306 can both make use of mechanical resonator 112' of device 100'. This may have the effect of avoiding leaking effects as in device 100 only the signal filter 104 is active wherein in device 100' only the mechanical resonator 112' is active. If antenna 300' is used, the respective other components can be active.

Figure 12:
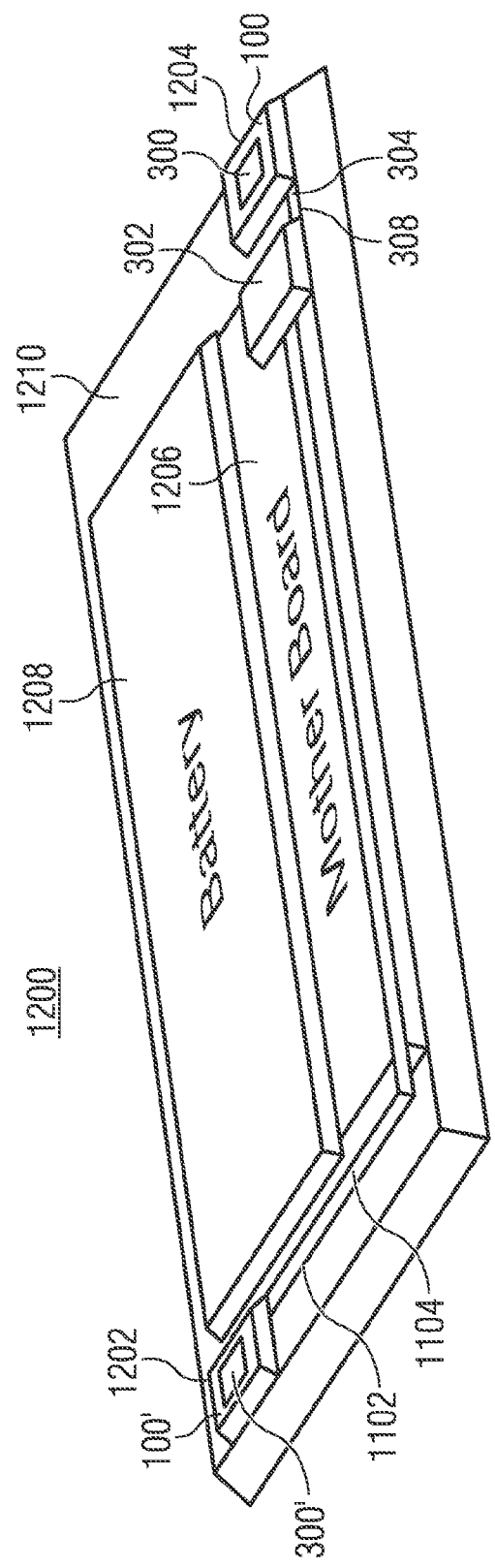
FIG. 12 illustrates schematically an example of a mobile device with two electrical devices.

FIG. 12 illustrates schematically an example of a mobile device 1200 with two electrical devices 100, 100'. RFEM (radio front end module) 1202 comprises device 100' and antenna 300' and RFEM 1204 comprises device 100 and antenna 300. Mobile device 1200 further comprises a mother board 1206, a battery 1208 and a part of a housing 1210. RFEM 1204 is connected to transceiver 302 via a shorter connection line than RFEM 1202. In other words, mobile device 1200 comprises a system 1100 and thus can have a reduced size and reduced costs for example compared to a mobile device with stand-alone oscillator resonators.

FIG. 13 illustrates a method 1300 for providing an electrical device. The method 1300 to provide an electrical device comprises forming 1302 a plurality of mechanical resonators of at least one signal filter 104 in a substrate 102 and forming 1304 at least one further mechanical resonator 112 in the substrate 102. Thus, according to the method it can be possible that all mechanical resonators of the substrate 102 can be formed in a common process which can be efficient and can reduce costs. Forming may comprise using semiconductor manufacturing processes, manufacturing the mechanical resonators or building the mechanical resonators. Method 1300 can comprise that the mechanical resonators of the substrate are formed using joint semiconductor processes.

Another example of method 1300 comprises processing 1306 of at least an area of the substrate between the plurality of mechanical resonators and the at least one further mechanical resonator with respect to its acoustic properties to provide an acoustic isolation. The area that is processed according to the method is thus an area of the acoustic isolation 602. Processing can comprise semiconductor processes, e.g. etching cuts and/or trenches and/or holes into the substrate.

Other examples of processing comprise mechanically removing of substrate material to provide cuts and/or trenches and/or holes in the substrate. Processing can also comprise adding at least one material with acoustic properties respectively different from the substrate material to the area. In some examples processing comprises adding at least one material, the material configured to attenuate acoustic waves. The materials can be added to the area that provides the acoustic isolation 602 or parts of the area that provides the acoustic isolation 602.

In other examples processing comprises stiffening and/or softening at least parts of the substrate material within the area by placing electronic elements of the electrical device on said parts. Electronic elements can for example be capacitors that are comprised in the signal filter 104.

Examples thus generally relate to a high-Q resonator (mechanical resonator) integration into a co-existence filter (signal filter) for low phase noise, cost and size LO (local oscillator) generation.

Some of the provided examples may allow implementation of a very low phase noise frequency source, low cost and low size. Provided examples suit high-end communication systems (5G, WiFi, LTE etc) frequency generation schemes. The frequency source of an oscillator is based on an external (e.g. in the electrical device) passive high-Q resonator (like: FBAR, BAW, SAW, ceramic, etc) and an internal (e.g. in a transceiver) oscillator.

Examples further present a method of integration of the high-Q resonator in an existing external coexistence filter implemented in the same technology, so that, there is almost no impact on the overall system size nor cost. Furthermore, examples present a new structure of the new external passive device (electrical device 100) that allows co-operation (co-running) of both functionalities (filtering and oscillations) while avoiding leaking effects. Thus, high-Q resonator integration into a co-existence filter for low phase noise, cost and size LO generation is provided.

Coexistence filters are used in most communication systems and are well-known (examples: FDD duplexer, WiFi RX co-existence, etc.). Oscillators with an external high-Q resonators (like: FBAR, BAW, SAW, etc.) are also well known in the industry. In some implementations the designers may use two standalone external devices. A first device contains the coexistence filter and the second device contains the resonator of the frequency oscillator.

However, the addition of the external resonator may have high impact on the system size and cost. In most cases such implementation would have the result that the implementation may not be realized. Therefore, providing device 100 and method 1300 can result in an electrical system with reduced costs, size and complexity.

Further examples are provided. The following examples are provided separately or in any combination. Therefore:

Example 1 shows an electrical device (100), comprising:
at least one signal filter (104) comprising a plurality of mechanical resonators (106, 108, 110) disposed in a substrate (102); and
at least one further mechanical resonator (112) disposed in the substrate (102) configured to oscillate at a reference frequency of an oscillator signal.

Example 2 shows an electrical device (100) according to example 1, wherein the at least one further mechanical resonator is isolated from the signal filter.

Example 3 shows an electrical device (100) according to example 1 or 2, further comprising: an isolation (114) of at least one the further mechanical resonator (112), the isolation (114) being con-figured to attenuate a leakage of a signal from the of at least one further mechanical resonator (112) into a signal of the signal filter (104), and/or to attenuate a leakage of a signal of the signal filter (104) into a signal of the of at least one further mechanical resonator (112).

Example 4 shows an electrical device (100) according to one of the preceding examples, the signal filter (104) comprising at least one additional mechanical resonator (402, 404) in the substrate (102) connected to at least one port (212, 214) of the signal filter (104), wherein a resonance frequency of the additional mechanical resonator (402, 404) is at the reference frequency.

Example 5 shows an electrical device (100) according to one of the preceding examples, the signal filter (104) comprising at least one additional signal path connected to at least one port (212, 214) of the signal filter (104), the at least one additional signal path comprising a reciprocal notch filter with a band-pass frequency at the reference frequency.

Example 6 shows an electrical device (100) according to one of the preceding examples, the signal filter (104) comprising at least one additional mechanical resonator (502) in the substrate (102), the additional mechanical resonator (502) connecting a positive branch (504) and a negative branch (506) of a signal filter (104) for differential signal processing.

Example 7 shows an electrical device (100) according to one of the preceding examples, wherein the signal filter (104) design is symmetric.

Example 8 shows an electrical device (100) according to one of the preceding examples, wherein an orientation of the further mechanical resonator (112) is different from an orientation of at least one mechanical resonator (106, 108, 110) of the plurality of mechanical resonators (106, 108, 110).

Example 9 shows an electrical device (100) according to one of the preceding examples, wherein an orientation of the further mechanical resonator (112) is different from an orientation of at least 50% of the mechanical resonators (106, 108, 110) of the plurality of mechanical resonators (106, 108, 110) of the filter (104).

Example 10 shows an electrical device (100) according to example 7 or 8, wherein an orientation angle of the at least one further mechanical resonator (112) differs about more than 20 degrees from an orientation angle of one mechanical resonator (106, 108, 110) of the plurality of mechanical resonators (106, 108, 110).

Example 11 shows an electrical device (100) according to one of the preceding examples, further comprising an acoustic isolation (602) configured to attenuate an acoustical wave propagation through the substrate (102) between the further mechanical resonator (112) and the signal filter (104).

Example 12 shows an electrical device (100) according to example 11, wherein the acoustic isolation (602) comprises at least one cut or trench or a plurality of holes in the substrate between the signal filter and the further mechanical resonator.

Example 13 shows an electrical device (100) according to examples 11 to 12, wherein the acoustic isolation (602) comprises a material different from a substrate material.

Example 14 shows an electrical device (100) according to example 13, wherein the material reaches continuously from one part of an edge of the substrate to an-other part of an edge of the substrate, positioned between the further mechanical resonator and the signal filter.

Example 15 shows an electrical device (100) according to example 13, wherein the material is attached non-continuously within an area between the further mechanical resonator and the signal filter.

Example 16 shows an electrical device (100) according to examples 11 to 15, further comprising at least two different acoustic wave propagation paths between the signal filter and the further mechanical resonator, wherein at least one of the two paths is configured to cause a phase shift of a propagating acoustic wave on said path to effect a destructive interference with an acoustic wave propagating along another path.

Example 17 shows an electrical device (100) according to example 16, wherein at least one of the two paths comprises a material with a predefined material property different from the material of another path to provide a different propagation speed of acoustic waves compared to the other path.

Example 18 shows an electrical device (100) according to examples 16 or 17, wherein at least one of the two paths is longer than another path.

Example 19 shows an electrical device (100) according to one of the preceding examples, wherein a mechanical resonator (106, 108, 110, 112) is a resonator of a group consisting of: a BAW-resonator, a SAW-resonator, a FBAR, a MEMS-resonator, a ceramic resonator.

Example 20 shows an electrical device (100) according to one of the preceding examples, wherein the reference frequency of the further mechanical resonator (112) is outside of a filter band of the signal filter (104).

Example 21 shows an electrical device (100) according to one of the preceding examples, comprising separated ports (212, 214, 216) for the signal filter (104) and the further mechanical resonator (112) respectively.

Example 22 shows an electrical device (100) according to one of the preceding examples, further comprising at least one active electrical component, the substrate (102) and the active electrical component being disposed within a common package.

Example 23 shows an electrical system (300) comprising:
an electrical oscillator (306);
an transceiver (302) and an antenna (310); and
an electrical device (100) according to examples 1 to 22, wherein the electrical oscillator (306) is connected to the further mechanical resonator via a first port (216) of the substrate (102); and
the transceiver (302) and the antenna (310) are connected to the signal filter (104) via a second (212) and a third port (214) respectively.

Example 24 shows the electrical system (300) of example 23, the transceiver (302) comprises the electrical oscillator (306).

Example 25 shows the electrical system (300) of example 23, the electrical device (100) comprising the electrical oscillator (306).

Example 26 shows the electrical system (300) of example 25, wherein the electrical device (100) and the electrical oscillator (306) are disposed within a common package.

Example 27 shows a method (1300) to provide an electrical device (100), the method (1300) comprising:
forming (1302) a plurality of mechanical resonators (106, 108, 110) of at least one signal filter (104) in a substrate (102); and
forming (1304) at least one further mechanical resonator (112) in the substrate (102).

Example 28 shows a method (1300) according to example 27, wherein the mechanical resonators (106, 108, 110, 112) of the substrate (102) are formed using joint semiconductor processes.

Example 29 shows a method (1300) according to example 27 or 28, the method further comprising: processing (1306) at least an area of the substrate (102) between the plurality of mechanical resonators and the at least one further mechanical resonator (112) with respect to its acoustic properties to provide an acoustic isolation (602).

Example 30 shows a method (1300) according to example 29, wherein processing (1306) comprises etching cuts (710) and/or trenches (706) and/or holes (702) into the substrate (102).

Example 31 shows a method (1300) according to example 29 or 30, wherein processing comprises mechanically removing of substrate material to provide cuts (710) and/or trenches (706) and/or holes (702) in the substrate.

Example 32 shows a method (1300) according to examples 29 to 31, wherein processing comprises adding at least one material (804) with acoustic properties respectively different from the substrate material (802) to the area.

Example 33 shows a method (1300) according to examples 29 to 32, wherein processing comprises adding at least one material (804), the material configured to attenuate acoustic waves.

Example 34 shows a method (1300) according to examples 29 to 33, wherein processing comprises stiffening and/or softening at least parts of the substrate material within the area by placing electronic elements of the electrical device (100) on said parts.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An electrical device, comprising:
   at least one signal filter comprising a plurality of mechanical resonators disposed in a substrate; and
   at least one further mechanical resonator disposed in the substrate and configured to oscillate at a reference frequency of an oscillator signal, and having an isolation configured to:
     attenuate a leakage of a signal from the at least one further mechanical resonator into a signal of the signal filter; and
     attenuate a leakage of the signal of the signal filter into the signal from the at least one further mechanical resonator.

2. An electrical device according to claim 1, wherein the signal filter comprises at least one additional mechanical resonator in the substrate connected to at least one port of the signal filter, wherein a resonance frequency of the additional mechanical resonator is at the reference frequency.

3. An electrical device according to claim 1, wherein the signal filter comprises at least one additional signal path connected to at least one port of the signal filter, wherein the at least one additional signal path comprises a reciprocal notch filter with a band-pass frequency at the reference frequency.

4. An electrical device according to claim 1, wherein the signal filter comprises at least one additional mechanical resonator in the substrate, wherein the additional mechanical resonator connects a positive branch and a negative branch of a symmetric signal filter for differential signal processing.

5. An electrical device according to claim 1, wherein an orientation of the further mechanical resonator is different from an orientation of at least one mechanical resonator of the plurality of mechanical resonators.

6. An electrical device according to claim 5, wherein an orientation angle of the at least one further mechanical resonator differs about more than 20 degrees from an orientation angle of one mechanical resonator of the plurality of mechanical resonators.

7. An electrical device according to claim 1, further comprising:
   an acoustic isolation configured to attenuate an acoustical wave propagation through the substrate between the further mechanical resonator and the signal filter.

8. An electrical device according to claim 7, wherein the acoustic isolation comprises at least one cut or trench or a plurality of holes in the substrate between the signal filter and the further mechanical resonator.

9. An electrical device according to claim 7, wherein the acoustic isolation comprises a material different from a substrate material, wherein the material is one of:
   a material that reaches continuously from one part of an edge of the substrate to another part of an edge of the substrate, positioned between the further mechanical resonator and the signal filter; or
   a material attached non-continuously within an area between the further mechanical resonator and the signal filter.

10. An electrical device according to claim 7, further comprising:
    at least two different acoustic wave propagation paths between the signal filter and the further mechanical resonator, wherein at least one path of the at least two different acoustic wave propagation paths is configured to cause a phase shift of a propagating acoustic wave on the at least one path to effect a destructive interference with an acoustic wave propagating along another path.

11. An electrical device according to claim 7, further comprising:
    at least two different acoustic wave propagation paths between the signal filter and the further mechanical resonator, wherein at least one path of the at least two different acoustic wave propagation paths is configured to cause a phase shift of a propagating acoustic wave on the at least one path to effect a destructive interference with an acoustic wave propagating along another path;
    wherein one or more of the at least two different acoustic wave propagation paths comprises a material with a predefined material property different from the material of another path to provide a different propagation speed of acoustic waves compared to the other path.

12. An electrical device according to claim 7, further comprising:
    at least two different acoustic wave propagation paths between the signal filter and the further mechanical resonator, wherein at least one path of the at least two different acoustic wave propagation paths is configured to cause a phase shift of a propagating acoustic wave on the at least one path to effect a destructive interference with an acoustic wave propagating along another path, wherein at least one of the at least two different acoustic wave propagation paths is longer than another path.

13. An electrical device according to claim 1, wherein a mechanical resonator is a resonator of a group consisting of: a BAW-resonator, a SAW-resonator, a FBAR, a MEMS-resonator, a ceramic resonator.

14. An electrical device according to claim 1, further comprising at least one active electrical component, wherein the substrate and the active electrical component are disposed within a common package.

15. An electrical system comprising:
an electrical device comprising:
at least one signal filter comprising a plurality of mechanical resonators disposed in a substrate; and
at least one further mechanical resonator disposed in the substrate configured to oscillate at a reference frequency of an oscillator signal;
an electrical oscillator coupled to the further mechanical resonator via a first port of the substrate;
a transceiver coupled to the signal filter via a second port; and
an antenna coupled to the signal filter via a third port.

16. The electrical system of claim 15, wherein the transceiver comprises the electrical oscillator.

17. The electrical system of claim 15, wherein the electrical device comprises the electrical oscillator, wherein the electrical device and the electrical oscillator are disposed within a common package.

18. An electrical device comprising:
a plurality of mechanical resonators of at least one signal filter in a substrate;
at least one additional mechanical resonator in the substrate, wherein the at least one additional resonator is configured to oscillate at a reference frequency of an oscillator signal; and
an acoustic isolation between the plurality of mechanical resonators and the at least one further mechanical resonator, wherein the acoustic isolation comprises an area of the substrate processed to have specified acoustic properties that isolate the plurality of mechanical resonators from the at least one further mechanical resonator.

19. The electrical device according to claim 18, further comprising one or more of:
etched cuts in the substrate;
trenches in the substrate; or
holes in the substrate.

\* \* \* \* \*